United States Patent
Gao et al.

(10) Patent No.: US 9,059,293 B2
(45) Date of Patent: Jun. 16, 2015

(54) ARRAY SUBSTRATE AND ITS MANUFACTURING METHOD

(71) Applicant: BOE TECHNOLOGY GROUP CO., LTD., Beijing (CN)

(72) Inventors: Tao Gao, Beijing (CN); Zhijun Lv, Beijing (CN); Tailiang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/967,536

(22) Filed: Aug. 15, 2013

(65) Prior Publication Data

US 2014/0048826 A1 Feb. 20, 2014

(30) Foreign Application Priority Data

Aug. 17, 2012 (CN) .......................... 2012 1 0295913

(51) Int. Cl.
*H01L 29/786* (2006.01)
*H01L 27/12* (2006.01)

(52) U.S. Cl.
CPC ........ *H01L 29/78642* (2013.01); *H01L 29/786* (2013.01); *H01L 29/78663* (2013.01); *H01L 27/1214* (2013.01)

(58) Field of Classification Search
CPC .............. H01L 27/1214; H01L 29/786; H01L 29/78663; H01L 29/7926; H01L 29/7889; H01L 29/78642; H01L 29/7827
USPC ............. 257/1, 2, 4, 5, 49, 57, 59, 60, 66, 72, 257/328, 329, E29.117, E29.118, E29.131, 257/E29.273, E29.274
See application file for complete search history.

(56) References Cited

U.S. PATENT DOCUMENTS

| | | | | |
|---|---|---|---|---|
| 4,924,279 | A * | 5/1990 | Shimbo | 257/58 |
| 6,144,422 | A | 11/2000 | Lee | |
| 6,765,267 | B2 * | 7/2004 | Lai | 257/359 |
| 8,203,662 | B2 * | 6/2012 | Kang et al. | 349/43 |
| 8,901,565 | B2 * | 12/2014 | Lan et al. | 257/59 |
| 2004/0070007 | A1 * | 4/2004 | Zhang | 257/200 |
| 2005/0258427 | A1 * | 11/2005 | Chan et al. | 257/72 |
| 2006/0125025 | A1 * | 6/2006 | Kawashima et al. | 257/401 |
| 2008/0014686 | A1 | 1/2008 | Wang et al. | |
| 2009/0072236 | A1 * | 3/2009 | Lai | 257/59 |

OTHER PUBLICATIONS

First Chinese Office Action dated Jul. 2, 2014; Appln. No. 201210295913.1.
Second Chinese Office Action Appln. No. 201210295913.1; Dated Feb. 15, 2015.

* cited by examiner

*Primary Examiner* — Eduardo A Rodela
(74) *Attorney, Agent, or Firm* — Ladas & Parry LLP

(57) ABSTRACT

An array substrate comprises a substrate, a gate electrode, a source electrode and a drain electrode, the source electrode and the drain electrode being provided in different areas on the substrate and the vertical projections of the source electrode and the drain electrode on the substrate having an overlapping area; a semiconductor layer formed between the source electrode and the drain electrode, a vertical projection of the semiconductor layer on the substrate having overlapping areas with the vertical projections of the source electrode and the drain electrode on the substrate; a first insulating layer formed on the substrate while below the gate electrode and covering the source electrode or the drain electrode; a pixel electrode, a gate line, and a data line. A manufacturing method for the array substrate is also disclosed.

20 Claims, 9 Drawing Sheets

ARRAY SUBSTRATE AND ITS MANUFACTURING METHOD

BACKGROUND

Embodiments of the present disclosure disclose an array substrate and a manufacturing method thereof.

In the display technology field, panel display devices, such as thin film transistor liquid crystal displays (TFT-LCDs) and organic light emitting displays (OLEDs), have advantages of lightness, slimness, low power consumption, high-luminance as well as better display quality etc., and play a very important role in the panel display field.

Aperture ratio is an important index for determining the high-luminance of the panel display device. A higher aperture ratio creates a higher rate of light transmission. The current methods for improving aperture ratio of pixels comprises more advanced precision processing technology, decreasing areas occupied by wiring portions and the thin film transistor (TFT) of each pixel, thus improving the light transmittance of pixels.

However, due to limitation of the existing precision processing technology, such as the limitation for exposure accuracy, further minimization of a TFT is restricted. As shown in FIG. 1, a typical bottom-gate thin film transistor is illustrated, in which the gate electrode 101 is provided on a glass substrate 100, a semiconductor layer 102 is provided between the gate electrode 101 and the source and drain electrodes (the source electrode 103 and the drain electrode 104), and the source electrode 103 and the drain electrode 104 are provided at a same layer and spaced apart from an ohmic contact layer 105, and furthermore, a gate insulating layer 106 is provided between the gate electrode 101 and the semiconductor layer 102. As shown in FIG. 2, the area occupied by the TFT consists of the area occupied by the source electrode 103, the drain electrode 104 as well as the semiconductor layer 102 between the source electrode and the drain electrode.

The TFT of the above configuration is relatively large in area, and aperture ratio of the corresponding panel display device is lower. When the dimensions of the source electrode and the drain electrode are given, only the distance of the channel between the source electrode and the drain electrode can be decreased; however, a narrower channel can not be achieved due to the limited exposure accuracy of the existing exposure machines.

In addition, the alignment accuracy between the gate electrode of a TFT and the source electrode and the drain electrode of the TFT determines the degree of uniformity in display quality. One main reason for non-uniform display quality is that the capacitance C1 between the gate electrode and the source electrode does not equal to the capacitance C2 between the gate electrode and the drain electrode. By providing the gate electrode at a position in a layer different from the source electrode and the drain electrode and further the right middle between the source electrode and the drain electrode, its possible to make the capacitance C1 between the gate electrode and the source electrode approximately equal or equal to the capacitance C2 between the gate electrode and the drain electrode. However, in the existing TFT manufacturing technology, the source electrode 103 and the drain electrode 104 are made in a same layer, making it very difficult for the gate electrode 101 of each TFT to align with the source electrode 103 and the drain electrode 104, that is, difficult for the source electrode and the drain electrode to be symmetrical with respect to the gate electrode. This creates certain alignment error between the gate electrode 101 and the source and drain electrodes, and such error occurs in the structure of each TFT. With reference to the structural top view of the array substrate shown in FIG. 2, the gate electrode 101 is not aligned appropriately with the source electrode 103 and the drain electrode. If processes such as multiple exposures are needed to form all of the TFTs of a display panel, then because the TFTs formed in different exposure processes have distinct alignment error between the gate electrode 101 and the source electrode and the drain electrode, the picture chrominance corresponding to the TFTs on the entire array substrate are non-uniform, and the formed image is bad in its quality.

Moreover, in the current TFT design manner, the gate electrode comprises a certain thickness, and a certain step is formed between the gate electrode and the glass substrate, the height of the step is the thickness of the gate electrode, and the step makes the thickness of the gate insulating layer not extremely thin. If the thickness is too small, breakage of the gate insulating layer may occur. However, when the gate insulating layer is too big, a higher switching current for the TFT is required, which is adverse for improving the electrical property of the TFT.

In the current TFT configuration, the source electrode and the drain electrode are designed to be formed at a same level, and have no overlapping portions in the vertical direction, which gives rise to a relatively large TFT area, a lower aperture ratio of pixels; furthermore, in the current design manner for TFT, a greater alignment error exists between the gate electrode and the source and drain electrodes, which may cause non-uniform image chrominance for a display device, and the quality of displayed images is not good.

SUMMARY

Embodiments of the present disclosure provide an array substrate and its manufacturing method, which is capable of improving the aperture ratio of pixels in a panel display device.

One aspect of the present disclosure provides an array substrate, comprising: a substrate, a gate electrode, a source electrode and a drain electrode, wherein the source electrode and the drain electrode are provided in different areas on the substrate, and vertical projections of the source electrode and the drain electrode on the substrate have an overlapping area; a semiconductor layer formed between the source electrode and the drain electrode, wherein a vertical projection of the semiconductor layer on the substrate has overlapping areas with the vertical projections of the source electrode and the drain electrode on the substrate; a first insulating layer formed on the substrate while below the gate electrode and covering the source electrode or the drain electrode; a pixel electrodes electrically connected with the drain electrode; a gate line electrically connected with the gate electrode; and a data line electrically connected with the source electrode.

Another aspect of the present disclosure provides a display device comprising the array substrate.

Yet another aspect of the present disclosure provides a method for preparing the array substrate, comprising: forming a source electrode and a data line on a substrate; forming a semiconductor layer on the source electrode, wherein a vertical projection of the semiconductor layer has an overlapping area with a vertical projection of the source electrode on the substrate; forming a drain electrode on the semiconductor layer, wherein a vertical projection of the semiconductor layer has an overlapping area with the vertical projections of the source electrode and the semiconductor layer on the substrate; forming a first insulating layer on the substrate covering the entire substrate; forming a gate electrode and a gate line on the first insulating layer in different areas of the substrate from the source electrode, the semiconductor layer and the drain electrode; forming a via hole exposing the drain electrode on the first insulating layer covering the drain electrode; and forming a pixel electrode on the substrate electrically connected with the drain electrode through the via hole.

Still another aspect of the present disclosure provides another method for preparing the array substrate, comprising: forming a pixel electrode on a substrate; forming a drain electrode on the substrate electrically connected with the pixel electrode; forming a semiconductor layer on the drain electrode, wherein a vertical projection of the semiconductor layer has an overlapping area with a vertical projection of the drain electrode on the substrate; forming a source electrode and a data line electrically connected with the source electrode on the semiconductor layer, wherein a vertical projection of the source electrode has an overlapping area with a vertical projection of the semiconductor layer on the substrate; forming a first insulating layer on the substrate covering the entire substrate; and forming a gate electrode and a gate line on the first insulating layer in different areas of the substrate from the source electrode, the semiconductor layer and the drain electrode.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein.

DETAILED DESCRIPTION

Figure 1:
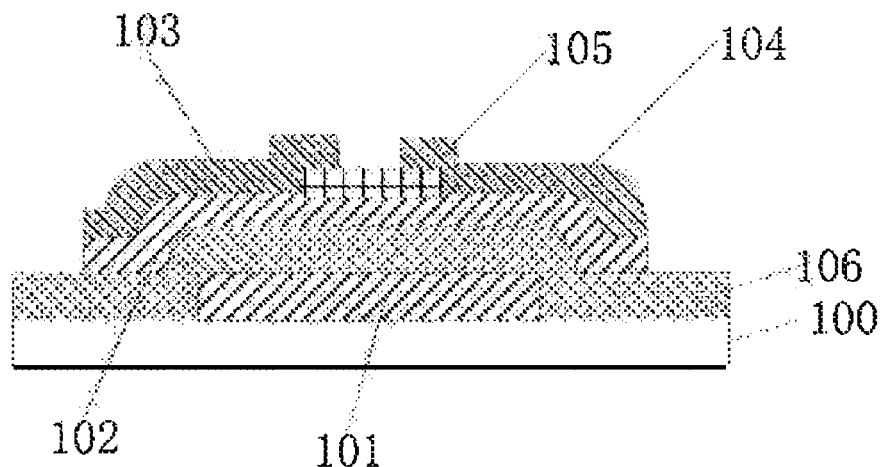
FIG. 1 is a schematic sectional view of the configuration of an existing bottom-gate thin film transistor.
Figure 2:
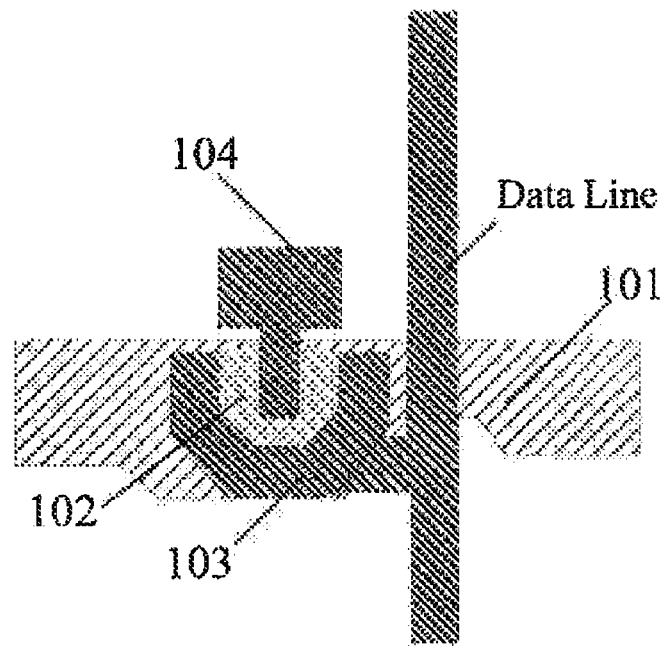
FIG. 2 is a schematic top view of the configuration of the existing bottom-gate thin film transistor.

To make clearer the object, technical solutions and advantages of the embodiments of the present disclosure, a clear and full description of the technical solution of the embodiment of the present disclosure will be made with reference to the accompanying drawings of the embodiment of the present disclosure. Obviously, the described embodiments are merely part of the embodiments of the present disclosure, but not all the embodiments.

Unless defined otherwise, the technical or science terminologies used herein should take the meaning commonly understood by the ordinary skilled in the relevant field of the present disclosure. The phrases such as "first", "second" and the like used in this disclosure as well as claims do not represent any sequence, quantity or importance, but are used for distinguishing different components from each other. Further, "a," "an," "the" and the like do not mean quantitative restriction but refer to the existence of at least one article. The phrases such as "comprise," "comprising," "contain," "containing" or the like are intended to mean that the elements or articles before the phrases encompass the elements or articles and the equivalent thereof listed after the phrases, and do not exclude other elements or articles. The phrases such as "connecting," "connected" or the like are not limited to physical or mechanical connections, but may comprise electrical connection, no matter directly or indirectly. Further, the phrases such as "on," "under," "left," "right" or the like are used only for describing a relative positional relationship, which will be varied correspondingly when the described objects are changed in its absolute position.

An embodiment of the present disclosure provides an array substrate and its manufacturing method, which are capable of improving the aperture ratio of pixels in a panel display device.

In the array substrate provided by an embodiment of the present disclosure, the source electrode and the drain electrode are formed on the substrate and arranged in opposition to each other in vertical direction; that is, the source electrode and the drain electrode are provided at different layers on the substrate, and furthermore, the vertical projections of the source electrode and the drain electrode on the substrate partially or entirely overlap with each other. Due to such an arrangement in which the source electrode and the drain electrode are arranged oppositely in vertical direction, the area occupied by TFT is remarkably decreased, thus improving the aperture ratio of pixels in the panel display device.

In the array substrate provided by the embodiment of the present disclosure, the gate electrode of the thin film transistor of each pixel unit is formed on the substrate in an area different from the source electrode and the drain electrode, and is insulated from the source electrode and the drain electrode as well. The vertical distance from the gate electrode to the source electrode may equal to the vertical distance from the gate electrode to the drain electrode, and the overlapping area between the gate electrode and the source electrode may equal to the overlapping area between the gate electrode and the drain electrode, thus the capacitance C1 formed by the gate electrode and the source electrode equals to the capacitance C2 formed by the gate electrode and the drain electrode, eliminating the problem of overlapping crosstalk of the source electrode and the drain electrode with the gate electrode respectively, which is induced by the imbalance between the capacitances C1 and C2, and further avoiding the problem of uneven chrominance of display in the panel display device caused by the overlapping crosstalk.

Figure 3:
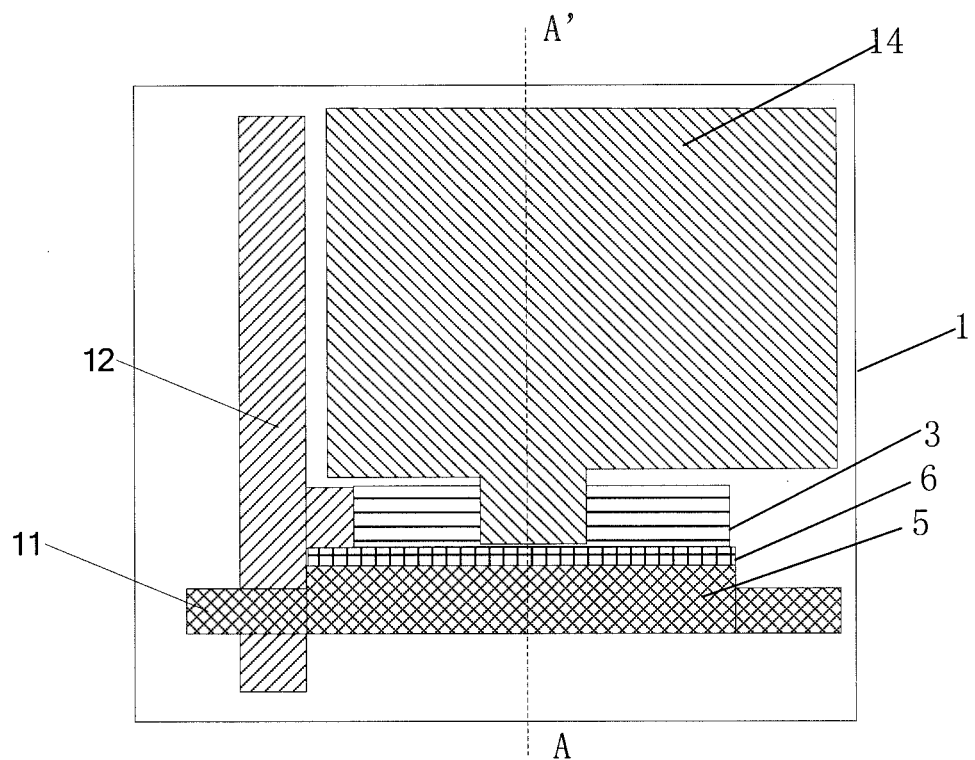
FIG. 3 is a schematic top view of the structure of one pixel in the array substrate provided by an embodiment of the present disclosure.
Figure 4:
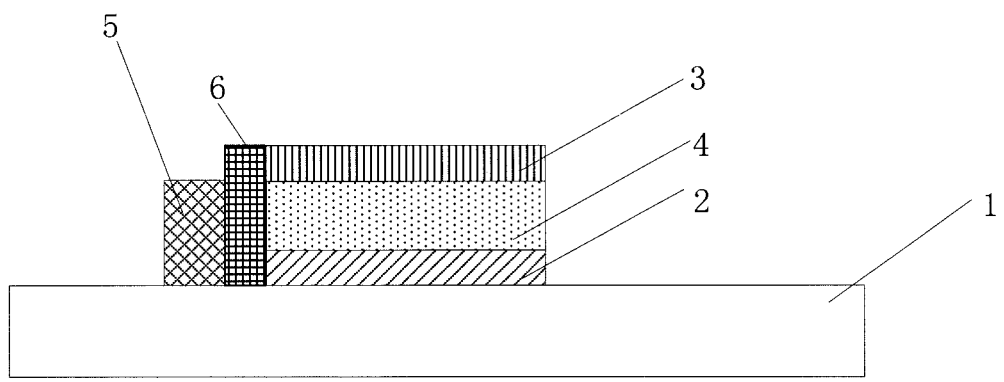
FIG. 4 is a schematic sectional view along line A-A' of the TFT in FIG. 3.

Referring FIGS. 3 and 4, the array substrate provided by an embodiment of the present disclosure comprises a substrate 1, a gate electrode 5, a source electrode 2 and a drain electrode 3, the source electrode 2 and the drain electrode 3 are provided on the substrate 1 in an area different from the gate electrode 5, and the vertical projections of the source electrode 2 and the drain electrode 3 on the substrate 1 comprise an overlapping area.

A semiconductor layer 4 is formed between the source electrode 2 and the drain electrode 3, and the vertical projection of the semiconductor layer 4 on the substrate 1 has overlapping areas with the vertical projections of the source electrode 2 and the drain electrode 3 on the substrate 1. A first insulating layer 6 is formed on the substrate 1 and provided between the gate electrode 5 and the source electrode 2, the drain electrode 2 and the semiconductor layer 4.

The array substrate further comprises a pixel electrode 14, and the pixel electrode 14 is connected to the drain electrode 3; the gate line 11 is connected to the gate electrode 5; the data line 12 is connected to the source electrode 2.

As shown in FIG. 3, the gate electrode 5, the source electrode (which is provided below the drain electrode, not shown in FIG. 3), the drain electrode 3 and the semiconductor layer constitute a thin film transistor.

Figure 5:
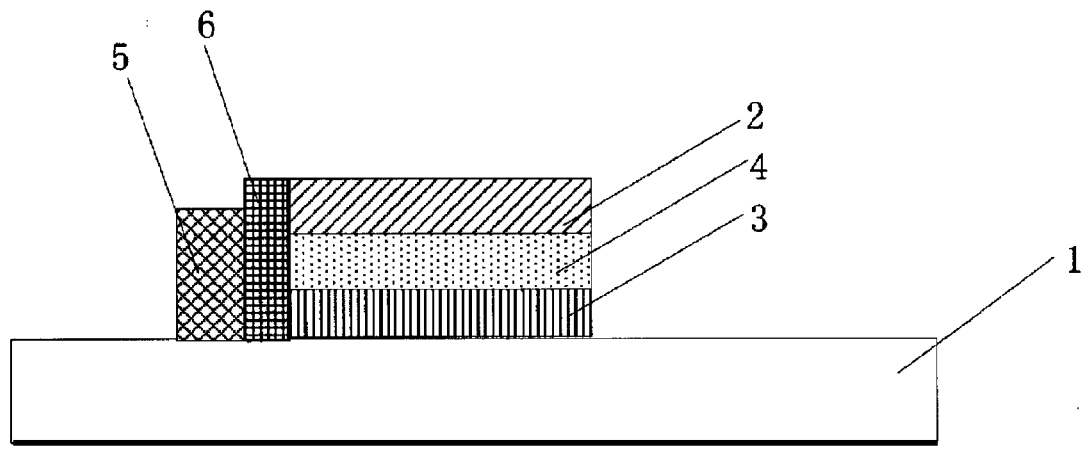
FIG. 5 is another schematic sectional view along line A-A' of the TFT in FIG. 3.

The thin film transistor may have two configurations as shown in FIGS. 4 and 5, respectively.

As shown in FIG. 4, the TFT may comprises: the gate electrode 5 formed on the substrate 1, the source electrode 2 and the drain electrode 3 formed on the substrate 1 in an area different from the gate electrode 5 and arranged oppositely in the vertical direction to the substrate 1, and the semiconductor layer 4 formed between the source electrode 2 and the drain electrode 3. The source electrode 2 is formed on the substrate 1, the semiconductor layer 4 is formed on the source electrode 2, and the drain electrode 3 is formed on the semiconductor layer 4. The gate electrode 5 is insulated from the source electrode 2, the drain electrode 3 and the semiconductor layer 4 with the first insulating layer 6. The first insulating layer 6 is just arranged between the gate electrode 5 and the source electrode 2, the drain electrode 3 and the semiconductor layer 4, so as to ensure the gate electrode 5 insulated from the source electrode 2, the drain electrode 3, and the semiconductor layer 4.

The TFT shown in FIG. 5 is essentially identical to the TFT shown in FIG. 4 in the configuration, and the difference lies in that the drain electrode 3 is formed on the substrate 1, the semiconductor layer 4 is formed on the drain electrode 3, and the source electrode 2 is formed on the semiconductor layer 4.

Figure 6:
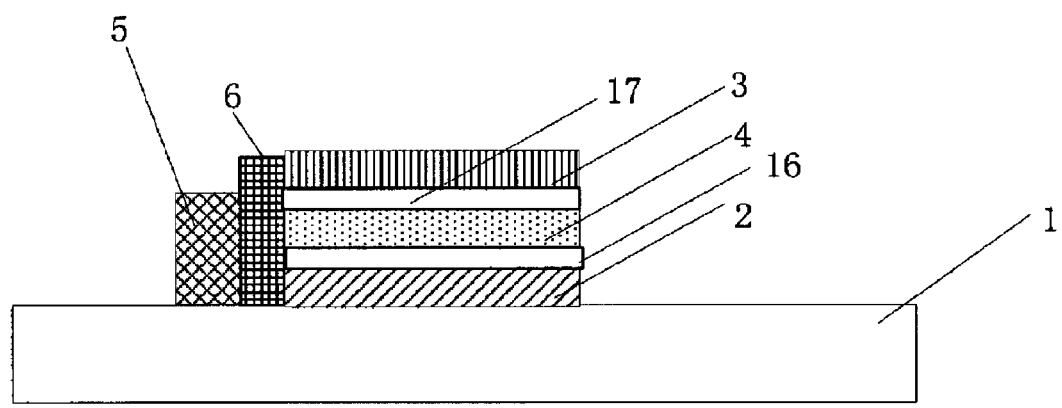
FIG. 6 is a schematic sectional view of the configuration of another kind of TFT provided by an embodiment of the present disclosure.

In order to make better the conductivity between the semiconductor layer 4 and the source electrode 2 as well as the drain electrode 3, with reference to FIG. 6, in the TFT provided in an embodiment of the present disclosure, a first ohmic contact layer 16 is further provided between the semiconductor layer 4 and the source electrode 2, and a second ohmic contact layer 17 is further provided between the semiconductor layer 4 and the drain electrode 3. The first ohmic contact layer 16 and the second ohmic contact layer 17 comprise an overlapping area with the vertical projections of the source electrode 2, the drain electrode 3, and the semiconductor layer 4 on the substrate.

With the TFT provided by the embodiment of the present disclosure, the source electrode 2 and the drain electrode 3 are arranged in an overlapping mode (which means that the source electrode 2 and the drain electrode 3 comprise an overlapping area in a vertical direction), thus reducing the area occupied by a TFT within a pixel region and improving the aperture ratio of pixels in the display device.

To further decrease the area occupied by a TFT within a pixel region on the array substrate, it's preferable that the vertical projections of the source electrode 2, the drain electrode 3 and the semiconductor layer 4, as well as the first ohmic contact layer 16 and the second ohmic contact layer 17, on the substrate 1 overlapping entirely.

For example, the semiconductor layer 4 may be but not limited to an amorphous silicon (a-Si) layer, a polycrystalline silicon layer, and may also be a metal oxide (for example, Indium-Gallium-Zinc oxide, In—Ga—Zn—O) layer or the like.

For example, the distance of the gate electrode 5 from the source electrode 2 equals to the distance of the gate electrode 5 from the drain electrode 3. For example, the source electrode 2 and the drain electrode 3 are equal in thickness. For example, the first ohmic contact layer 16 and the second ohmic contact layer 17 are equal in thickness. If the overlapping area of the gate electrode 5 with the source electrode 2 can equal to the overlapping area of the gate electrode 5 with the drain electrode 3, it may be ensured that the capacitance C1 formed between the gate electrode 5 and the source electrode 2 equals to the capacitance C2 formed between the gate electrode 5 and the drain electrode 3 (that is to say, C1=C2).

Hence, the embodiment eliminates the overlapping crosstalk problem of the source electrode and the drain electrode with the gate electrode respectively caused by the imbalance between C1 and C2, and further avoids the problem of uneven chrominance of display in the panel display caused by the overlapping crosstalk. It's possible to ensure the displayed images have even chrominance and high picture quality.

Figure 7:
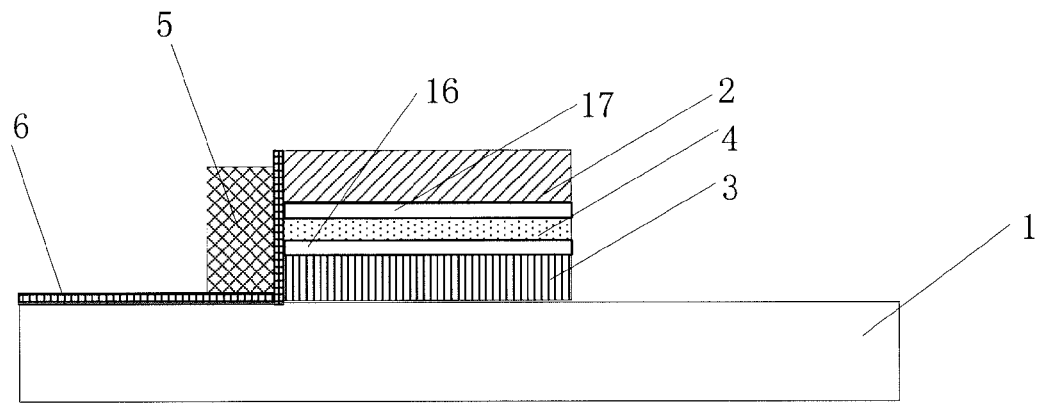
FIG. 7 is a schematic sectional view of the configuration of another kind of TFT provided by an embodiment of the present disclosure.

Each of the TFT configurations as shown in FIGS. 4 and 5 can accurately control the relative positions between the gate electrode 5 and the source electrode 2 as well as the drain electrode 3. Preferably, the gate electrode 5 is formed on the first insulating layer 6 which is provided on the substrate 1, as shown in FIG. 7. The arrangement configuration of the source and drain electrodes in the TFT shown in FIG. 7 corresponds that shown in FIG. 5; of course, this is only a schematic example. The arrangement configuration of the source and drain electrodes in the TFT shown in FIG. 7 may also correspond to that shown in FIG. 4. Since each of the source electrode 2, the drain electrode 3, the gate electrode 5 as well as the semiconductor layer 4 is provided on the substrate 1 by film-forming technology, each film layer is parallel to the substrate 1, and each film layer has a uniform thickness. Furthermore, the portion of the first insulating layer 6 below the gate electrode 5 is also parallel to the substrate 1. The thickness of each film layer can be controlled by a film forming equipment, when the thickness of a film layer reaches a preset value, the film plating equipment can stop the formation of the film layer.

When the thicknesses of the source electrode 2, the drain electrode 3, the first ohmic contact layer 16 and the second ohmic contact layer 17 as well as the semiconductor layer 4 are determined, the thickness of the first insulating layer 6 between the gate electrode 5 and the substrate 1 is also determined to ensure the distance of the gate electrode 5 from the source electrode 2 equal to the distance of the gate electrode 5 from the drain electrode 3. By designing a first insulating layer 6 of a proper thickness so as to arrange the gate electrode 5 between the source electrode 2 and the drain electrode 3 symmetrically in the vertical direction, it's possible to ensure the capacitance C1 formed between the gate electrode 5 and the source electrode 2 equals or approximates the capacitance C2 formed between the gate electrode 5 and the drain electrode 3 (i.e., C1=C2), so that the displayed images of the display device have uniform chrominance and high picture quality.

In order to ensure the values of C1 and C2 further approximate with each other, the thicknesses of the source electrode 2 and the drain electrode 3 may be equal to each other.

Due to the source electrode and the drain electrode are in the strip configurations, which are parallel to the gate line and perpendicular to the data line and have certain widths (which can also be called as transverse widths), for example, the transverse widths of the source electrode 2 and the drain electrode 3 may equal to each other, such that the values of C1 and C2 are equal to each other.

Figure 8:
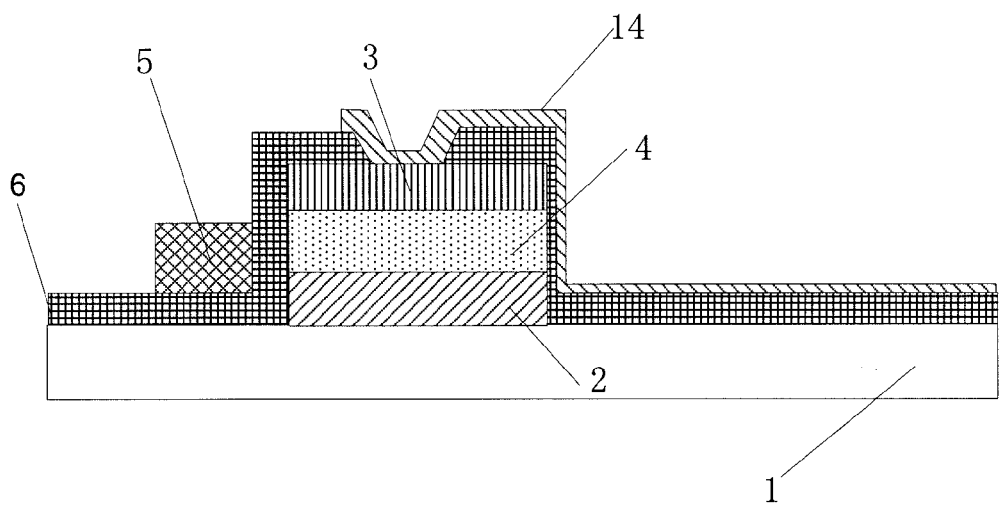
FIG. 8 is a schematic sectional view of the structure of the TFT in the array substrate provided by an embodiment of the present disclosure.

Preferably, referring to FIG. 8, in the configuration of the TFT in the array substrate provided by the embodiment of the present disclosure corresponding to the TFT shown in FIG. 4, the pixel electrode 14 is formed above the drain electrode 3, and by forming a via hole on the first insulating layer 6 and above the drain electrode 3, the pixel electrode 14 is electrically connected with the drain electrode 3 through the via hole.

Figure 9:
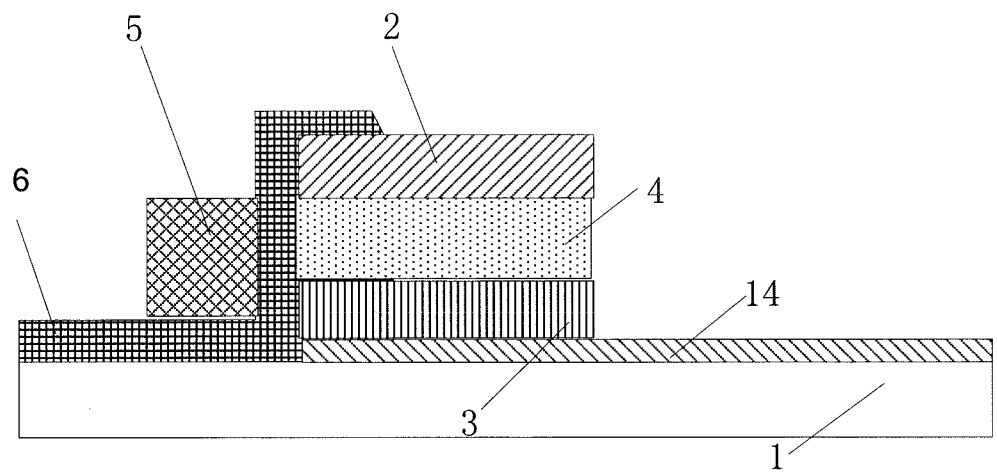
FIG. 9 is a schematic sectional view of the structure of the TFT in another kind of array substrate provided by an embodiment of the present disclosure.

FIG. 9 shows the configuration of the TFT in another kind of array substrate provided by the present disclosure corresponding to the TFT shown in FIG. 5, the pixel electrode 14 is formed on the substrate 1, the drain electrode 3 is provided on the substrate 1 and electrically connected to the pixel electrode 14.

Figure 10:
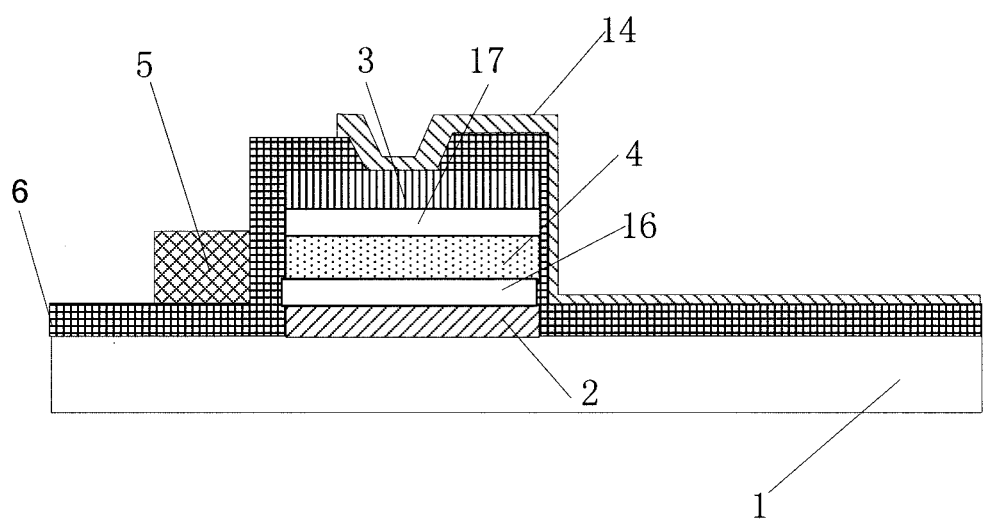
FIG. 10 is a schematic sectional view of the structure of the TFT in another kind of array substrate provided by an embodiment of the present disclosure.

FIG. 10 is a schematic sectional view of the structure of the TFT in another kind of array substrate provided by the present disclosure, corresponding to the TFT shown in FIG. 6.

As to the array substrates as shown in FIGS. 8 and 9, the relative positions between the gate electrode 5 and the source electrode 2 as well as the source electrode 2 are regulated by controlling the thickness of the first insulating layer 6. When the gate electrode 5 is relatively thin, a thick first insulating layer 6 is needed so as to meet the requirement that the vertical distance of the gate electrode 5 from the source electrode 2 equals to the vertical distance of the gate electrode 5 from the drain electrode 3, and the overlapping area of the gate electrode with the source electrode corresponds to the overlapping area of the gate electrode with the drain electrode, thus the capacitance C1 formed by the gate electrode and the source electrode equals to the capacitance C2 formed by the gate electrode and the drain electrode. On the other hand, the electricity behavior of the TFT depends at least partially on the thickness of the first insulating layer 6, and the thinner the first insulating layer 6 is, the lower the turn-on voltage of the TFT is, and it's easier for the TFT to turn on; to the contrary, the thicker the first insulating layer 6 is, the greater the turn-on voltage of the TFT is, and it's more difficult for the TFT to turn-on.

Under the prerequisite condition that the vertical distance of the gate electrode 5 from the source electrode 2 equals to the vertical distance of the gate electrode 5 from the drain electrode 3, as well as the overlapping area of the gate electrode with the source electrode equals to the overlapping area of the gate electrode with the drain electrode, such that the capacitance C1 formed by the gate electrode and the source electrode equals to the capacitance C2 formed by the gate electrode and the drain electrode, an embodiment of the present disclosure intends to further decrease the thickness of the first insulating layer 6, the following modifications are made with respect to the array substrates of the embodiments as shown in FIGS. 8 and 9.

A groove corresponding to the source electrode or the drain electrode is provided on the substrate. The source electrode or the drain electrode is contained in the groove of the substrate.

Figure 11:
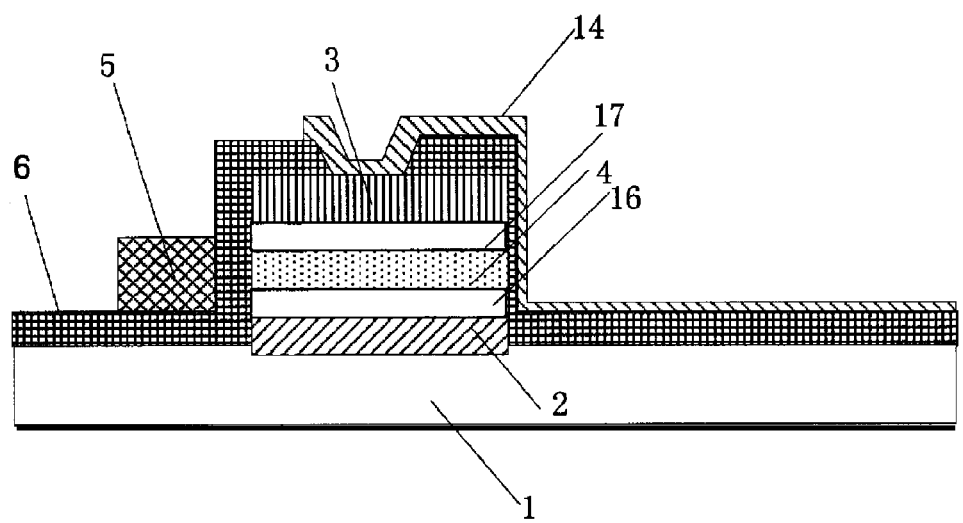
FIG. 11 is a schematic sectional view of the structure of the TFT in the array substrate provided by an embodiment of the present disclosure, and the array substrate comprising a groove.

For example, as shown in FIG. 11, the source electrode 2 in an embodiment of the present disclosure is formed in the groove 20 corresponding to it on the substrate 1. The groove 20 may be provided on the array substrate as shown in FIG. 8 or 9 and provided in the area on the substrate 1 corresponding to the source electrode 2, that is to say, provided in the substrate 1 right below the source electrode 2, such that the source electrode 2 or the drain electrode 3 can be exactly embedded within the groove. The depth of the groove 20 determines the thickness of the first insulating layer 6. When the minimum thickness of the first insulating layer 6 is determined, the depth of the groove is determined as well.

Please note that FIG. 11 only shows such an example in which the source electrode 2 is embedded into the substrate 1, and the example in which the drain electrode 3 is embedded into the substrate 1 is similar to that in FIG. 11.

Please note that, when the substrate is provided with a groove thereon, the arrangement configuration of the pixel electrode in the array substrate corresponding to the TFT as shown in FIG. 4 does not change. And the arrangement configuration of the pixel electrode in the array substrate, corresponding to the TFT as shown in FIG. 5, changes; for example, the pixel electrode is formed on the substrate and a part of the pixel electrode is formed in the groove also, the drain electrode is formed in the groove comprising the pixel electrode, the semiconductor layer is formed on the drain electrode, and the source electrode is formed on the semiconductor layer.

Figure 19:
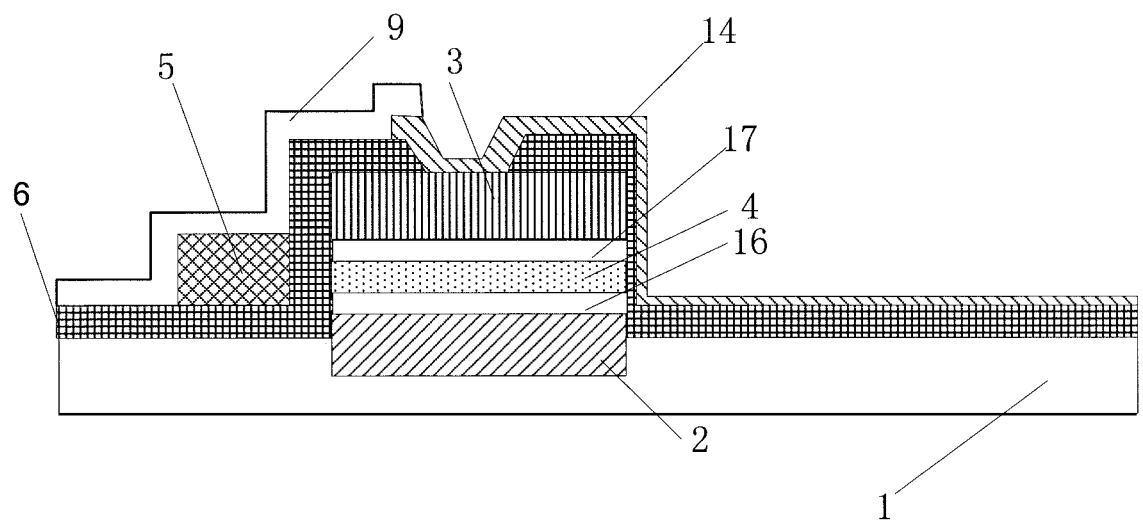
FIG. 19 is a structural view of the TFT in the array substrate in formation provided by the embodiment of the present disclosure, and the array substrate is formed with the second insulating layer.

Please note, as shown in FIG. 19, a second insulating layer is also formed above the gate electrode to provide protection for the film layer configuration of the TFT.

For example, the depth of the groove may be greater or less than the thickness of the source electrode or the drain electrode as required.

The above describes only the examples in which the substrate is provided with a groove corresponding to the source electrode or the drain electrode.

If the drain electrode is provided in the groove, the pixel electrode electrically connected with the drain electrode may also be provided in the groove, and the pixel electrode is provided below the drain electrode. In such an example, the depth of the groove may be greater, and the total thickness of the drain electrode and the pixel electrode may be less than the depth of the groove, such that the first insulating layer has a minimum thickness.

If the source electrode is provided in the groove, and the data line electrically connected with the source electrode and the source electrode may be formed in a same manufacturing process, then the data line may be provided in the groove, or the data line also may be provided on the substrate.

For example, if the thickness of the source electrode is greater than the depth of the groove, the data line can be prepared directly on the substrate, and it's not necessary to prepare the data line in the groove corresponding to the data line, thus saving manufacturing process for forming the groove corresponding to the data line. Furthermore, the data line may electrically contact with the source electrode desirably.

If both the data line and the source electrode are provided in the groove, then a groove corresponding to both the data line and the source electrode is required, for example a T-shaped groove, such that the data line and the source electrode electrically contact with each other desirably.

The substrate in each of the embodiments of the present disclosure may be a glass substrate with various film layers formed on the glass substrate.

When a groove is required to be provided on the substrate, the groove is necessary to formed on the glass substrate by a dry etching process; however, it's difficult to form a groove on the glass substrate, and more strict etching conditions are required.

For example, the substrate according to the embodiment of the present disclosure may also be a glass substrate formed with a passivation layer, in which the passivation layer is formed on the side of the glass substrate to be formed with a source electrode or a drain electrode, and the thickness of the passivation layer is not less than the depth of the groove to be formed.

In this way, the groove on the glass substrate formed within the passivation layer is such a groove formed within the passivation layer, and difficulty of forming the groove becomes less compared with the example in which the groove is made directly into the glass substrate, and the required etching conditions are relatively low.

The etching onto a glass substrate or a passivation layer is known, and the description thereof is omitted here for simplicity.

Description of the detail process for achieving the array substrate of the present disclosure is made in the following with respect to its process flow.

The method for preparing an array substrate provided by an embodiment of the present disclosure comprises the following steps S11~S17.

S11, forming a source electrode and a data line on the substrate through a patterning process.

S12, forming a semiconductor layer on the source electrode through a patterning process, the vertical projection of the semiconductor layer having an overlapping area with the vertical projection of the source electrode on the substrate.

S13, forming a drain electrode on the semiconductor layer through a patterning process, the vertical projection of the drain electrode having an overlapping area with the vertical projections of the source electrode and the semiconductor layer on the substrate.

S14, forming a first insulating layer covering the entire substrate through a patterning process.

S15, forming a gate electrode and a gate line on the first insulating layer in an area on the substrate different from the source electrode, the semiconductor layer and the drain electrode.

S16, forming one via hole on the first insulating layer covering the drain electrode through a patterning process, the via hole exposing the drain electrode.

S17, forming a pixel electrode on the substrate through a patterning process, the pixel electrode electrically connecting with the drain electrode through the via hole.

The patterning process is for example photolithography patterning process, and may comprise for example: coating a photoresist layer on the structural layer to be patterned, exposing the photoresist layer with a mask plate, developing the exposed photoresist layer to obtain a photoresist pattern, etching the structural layer with the photoresist pattern, and then optionally removing the photoresist pattern. The patterning process may also be methods such as screen printing, inkjet printing or the like.

In one example, prior to forming the source electrode and the data line, the method may further comprise: forming grooves on the substrate respectively corresponding to the source electrode and the data line to be formed later through a patterning process, and for example the groove corresponding to the source electrode and the groove corresponding to the data line are communicated with each other, such that the source electrode and the data line can be formed in the grooves and electrically connected with each other.

In one example, after forming the source electrode and the data line and prior to forming the semiconductor layer, the method further comprises: forming a first ohmic contact layer on the source electrode through a patterning process, the vertical projection of the first ohmic contact layer having an overlapping area with the vertical projection of the source electrode on the substrate; after forming the semiconductor layer and prior to forming the drain electrode, the method further comprises: forming a second ohmic contact layer on the semiconductor layer through a patterning process, the vertical projection of the second ohmic contact layer having an overlapping area with the vertical projection of the semiconductor layer on the substrate.

Taking the array substrate as shown in FIG. 11 for illustration, one example of the method for preparing the array substrate of the embodiment comprises the following steps.

Step 1, forming a groove on a glass substrate corresponding to a source electrode pattern.

If a data line is prepared in a groove as well, grooves corresponding to the source electrode and the data line need to be formed on the glass substrate simultaneously, and for example the groove corresponding to the source electrode and the groove corresponding to the data line are communicated with each other; or the grooves corresponding to the source electrode and the data line are formed integrally.

For example, a negative photoresist layer is firstly applied on a smooth glass substrate 1 having a passivation layer formed thereon, that is, the photoresist is provided on the passivation layer. With a mask plate corresponding to the groove to be formed, the region on the glass substrate 1 shielded by the mask plate become the groove region, then the portion of the photoresist unshielded by the mask plate (that is, the portion outside of the groove region) is subjected to exposure. The photoresist on the glass substrate after the exposure is developed, so that a groove pattern corresponding to the source electrode or both the source electrode and the data line are formed on the glass substrate. The negative photoresist remains on the glass substrate. This step achieves the groove pattern formed on the glass substrate.

Figure 12:
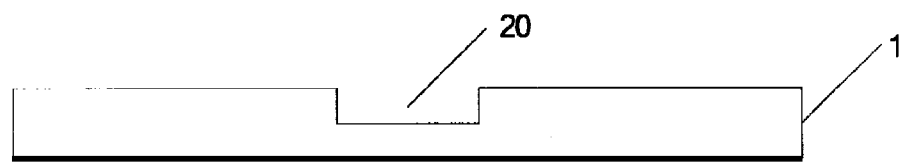
FIG. 12 is a structural view of the array substrate in formation provided by an embodiment of the present disclosure, and the array substrate is formed with a groove corresponding to the source electrode.
Figure 13:
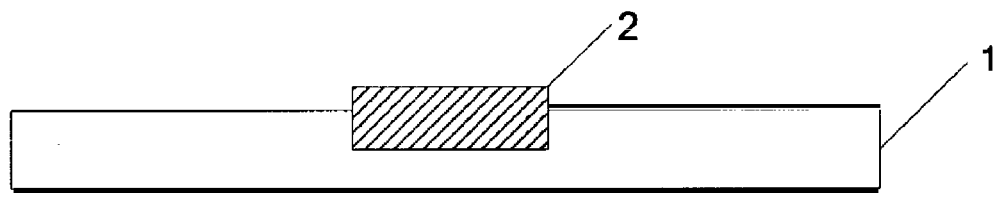
FIG. 13 is a structural view of the TFT in the array substrate in formation provided by the embodiment of the present disclosure, and the array substrate is formed with the source electrode.

After that, the glass substrate comprising the groove pattern is subjected to a dry etching, such that a groove corresponding to the source electrode or both the source electrode and the data line are etched out on the glass substrate. The resultant glass substrate 1 formed with the groove 20 is shown in FIG. 12. The groove of FIG. 12 embodies only the portion of the groove corresponding to the source electrode.

Now, photoresist still remains on the region of the glass substrate 1 except the groove 20; however, the remaining photoresist is not necessary to be removed in this step, and may be processed in the subsequent processes.

The depth of the groove 20 closes to the thickness of the source electrode or is less than the thickness of the source electrode, for example, may be of any value less than the thickness of the first insulating layer 6 as shown in FIGS. 3-10.

Preferably, the depth of the groove is less than the thickness of the source electrode. One step is formed between the source electrode and the glass substrate 1 so as to control the position of the gate electrode conveniently to align the gate electrode with the source electrode and the drain electrode. For example, its possible to control the thickness of the insulating layer below the gate electrode to align the gate electrode with the source electrode and the drain electrode, thus the gate electrode is provided between the source electrode and the drain electrode in the vertical direction to the substrate 1, the vertical distance of the gate electrode from the source electrode equals to the vertical distance of the gate electrode from the drain electrode, and the overlapping area of the gate electrode with the source electrode equals to the overlapping area of the gate electrode with the drain electrode, such that the capacitance C1 formed by the gate electrode and the source electrode equals to the capacitance C2 formed by the gate electrode and the drain electrode.

In the process for forming the groove pattern corresponding to the source electrode pattern, the data line pattern for the data line electrically connected to the source electrode is formed simultaneously, and in the following manufacturing processes, the source electrode and the data line may be manufactured simultaneously so as save process flow.

Step 2, forming the source electrode and the data line on the glass substrate.

For example, firstly, on the glass substrate comprising the groove formed in step 1, a metallic film layer of a thickness of about 1500 Å~2500 Å is deposited with a magnetron sputtering apparatus.

Next, the stripping of the remaining photoresist is performed, the photoresist as well as the metallic film layer thereon outside of the groove region is stripped off together, thus the source electrode 2 is formed on the glass substrate in the groove region and the data line is formed on the substrate or in the groove region. The stripping process of photoresist may be carried out with a known or future developed process, and its description is omitted here.

The metal layer may be molybdenum (Mo), aluminum (Al), copper (Cu), wolfram (W) and the like, or may be any composite layer of the aforesaid metals.

In the above process of forming the source electrode 2 and the data line, the metallic film is formed without removing the photoresist, thus saving the process flow. The reason is that stripping of the metallic film is performed after forming the metallic film, and in this stripping process, the metallic film and the photoresist outside of the groove region as well as the data line region are stripped off together, thus saving one step for removing a layer.

With the source electrode 2 in the groove of the glass substrate 1 in this embodiment, the layer of the source electrode 2 is partially or entirely arranged in the groove of the glass substrate (part or entire of the layer means in particular whether the layer goes beyond the glass substrate in the vertical direction), thus reducing the height of the source electrode formed on the glass substrate, and it's possible to make a thinner first insulating layer meanwhile the capacitances C1 and C2 equals to each other. The thinner the first insulating layer is, the greater the current flows through the TFT semiconductor layer would become under the same applied voltage, and the required turn-on voltage for the TFT (threshold voltage) would be minimized, thus it's possible to incur less energy consumption and the electrical property of the devices become better.

Step 3, forming a semiconductor layer on the glass substrate and a first ohmic contact layer and a second ohmic contact layer provided on the upper and lower sides of the semiconductor layer, respectively.

For example, on the glass substrate 1 formed with the source electrode 2 and the data line, a semiconductor layer having a thickness of about 800 Å~1500 Å is deposited with a Plasma Enhanced Chemical Vapor Deposition apparatus (PECVD). The semiconductor layer is subjected to a photolithography process (a wet etching process) so that a semiconductor layer overlaps the source electrode in the vertical direction is achieved. For example, the photolithography process may not be carried out in this step, and the semiconductor layer may be subjected to photolithography process in the subsequent process for preparing the drain electrode.

In the example of depositing an a-Si layer, amorphous silicon is deposited. The reactant gas corresponding to a-Si may be a mixed gas of silicane ($SiH_4$), hydrogen phosphate ($PH_3$) and hydrogen ($H_2$), or mixed gas of dichloro-dihydro-silicon ($SiH_2C_{12}$), $PH_3$ and $H_2$.

Figure 14:
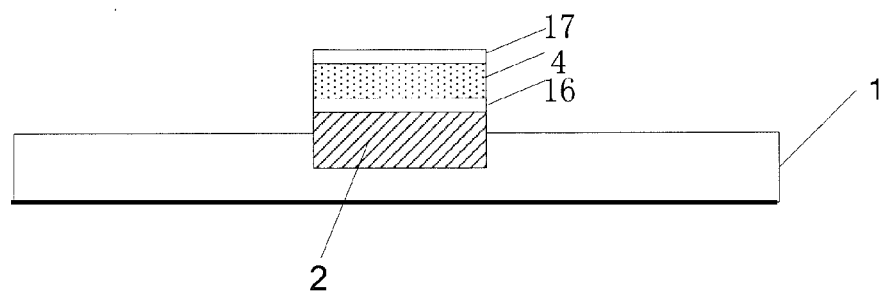
FIG. 14 is a structural view of the TFT in the array substrate in formation provided by the embodiment of the present disclosure, and the array substrate is formed with a semiconductor layer, a first ohmic contact layer, and a second ohmic contact layer.

For example, in order to achieve better conductivity of the semiconductor layer, a first ohmic contact layer and a second ohmic contact layer may be formed on the upper and lower sides of the semiconductor layer respectively. That is to say, as shown in FIG. 14, a doped semiconductor layer is firstly formed on the source electrode 2 as the first ohmic contact layer 16, then an amorphous silicon semiconductor layer 4 is formed on the first ohmic contact layer 16, and finally another doped semiconductor layer as the second ohmic contact layer 17 is formed on the semiconductor layer 4. The process of forming the first ohmic contact layer 16 and the second ohmic contact layer 17 may be the same as that of forming the semiconductor layer 4.

The reactant gas corresponding to the process of forming the first ohmic contact layer 16 and the second ohmic contact layer 17 may be a mixed gas of $SiH_4$ and $H_2$, or a mixed gas of $SiH_2C_{12}$ and $H_2$. The thickness of the first ohmic contact layer 16 and the second ohmic contact layer 17 may be about 500 Å~1000 Å. FIG. 14 shows the resultant TFT comprising the semiconductor layer 4, the first ohmic contact layer 16 and the second ohmic contact layer 17.

For example, the process of forming the semiconductor layer 4, the first ohmic contact layer 16 and the second ohmic contact layer 17 may be as follows.

A first ohmic contact layer 16 is evaporated onto the glass substrate 1 formed with the source electrode 2, then a semiconductor layer 4 is evaporated based on the above, and then a second ohmic contact layer 17 is further evaporated onto the semiconductor layer 4, it should be noted that all of the three layers in this process cover the entire glass substrate 1. Here, the following two methods may be adopted.

Firstly, the three conductive layers are subjected to a photolithography process, such that a first ohmic contact layer 16, a second ohmic contact layer 17 and a semiconductor layer 4 corresponding to the groove can achieved, and the conducting layers on the glass substrate 1 outside of the groove region is stripped off.

Secondly, it's not processed by this time, but the three layers are subjected to a photolithography process simultaneously in the subsequent process of preparing the drain electrode, thus reducing the process flow.

Step 4, forming a drain electrode on the glass substrate.

For example, a layer of metal film having a thickness of about 1500 Å~2000 Å is firstly deposited on the glass substrate formed with the semiconductor layer 4 by a sputtering or thermally evaporating method.

For example, in order to make the capacitance C1 formed by the gate electrode and the source electrode approximates or equals to the capacitance C2 formed by the gate electrode and the drain electrode, the thickness of the drain electrode equals to the thickness of the source electrode during the film-forming process.

For example, in order to make the capacitance C1 formed by the gate electrode and the source electrode approximate or equal to the capacitance C2 formed by the gate electrode and the drain electrode, the material of the gate electrode and the material of the source electrode are identical to each other, both of which may be selected from metals such as Mo, Al, Cu, W and etc. or may be any composite layer of the aforesaid metals.

Then, a positive photoresist layer is coated onto the substrate formed with the above layers (the layers for the semiconductor layer and the drain electrode to be formed), and after exposure and development, the photoresist on the glass substrate is formed into a semiconductor layer pattern and a drain electrode pattern over the source electrode. The portion of the photoresist outside of the drain electrode pattern is exposed.

For example, the widths of the source electrode, the semiconductor layer as well as the drain electrode are identical to each other, and the vertical projections of them on the substrate overlap with each other so as to ensure the capacitance C1 formed by the gate electrode and the source electrode approximates or equal to the capacitance C2 formed by the gate electrode and the drain electrode, thus improving the conductive property of the semiconductor layer.

With an etching process, the portion of the photoresist on the glass substrate outside of the drain electrode pattern is stripped off, and the metallic film layer below the photoresist and outside of the drain electrode pattern is also removed, while the drain electrode corresponding to the groove and the photoresist on the drain electrode are remained.

Finally, with a photoresist removal process, the photoresist on the drain electrode is stripped off, thus obtaining the drain electrode. In this step, the steps formed by the source electrode, the drain electrode and the semiconductor layer align with each other; the alignment error is the minimized. Moreover, the semiconductor layer formed in step 3 and the metallic film layer formed in step 4 may be formed same one film-formation process, thus simplifying the process flows and reducing manufacturing costs. The resultant array substrate comprising the drain electrode is shown in FIG. 15.

Figure 15:
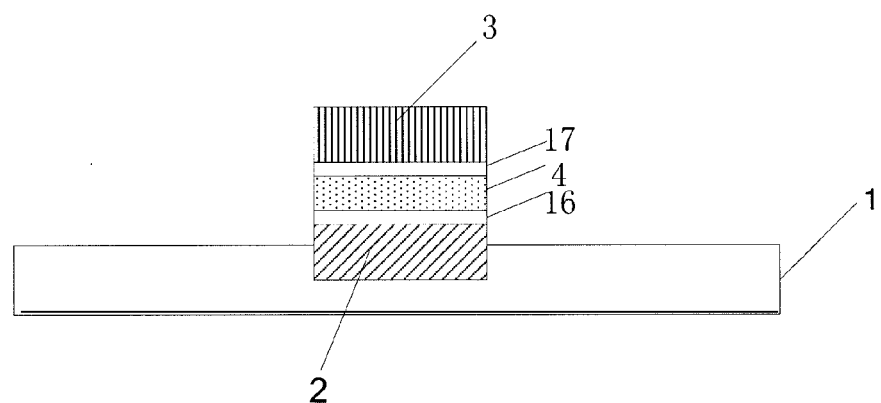
FIG. 15 is a structural view of the TFT in the array substrate in formation provided by the embodiment of the present disclosure, and the array substrate is formed with a drain electrode.
Figure 16:
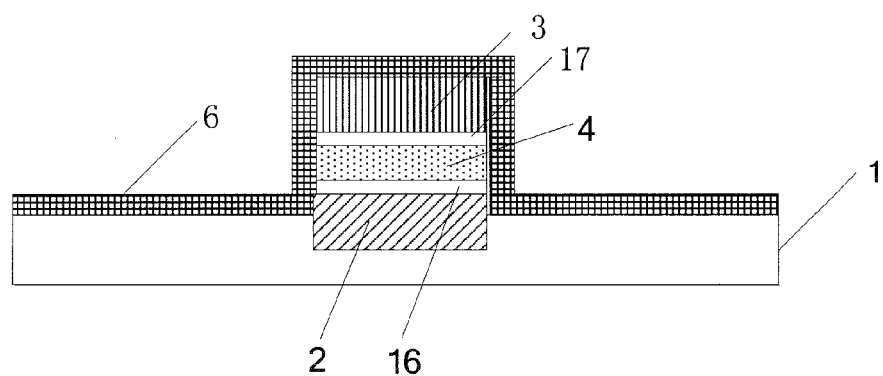
FIG. 16 is a structural view of the TFT in the array substrate in formation provided by the embodiment of the present disclosure, and the array substrate formed with the first insulating layer.

Step 5, forming a first insulating layer 6 on the substrate having the TFT configuration as shown in FIG. 15, the formed array substrate being shown in FIG. 16.

For example, an insulating layer film having a thickness of about 2500 Å~4000 Å is deposited with a Plasma Enhanced Chemical Vapor Deposition (PECVD) apparatus.

The material for forming the first insulating layer 6 may be SiNx, SiOx or the composite thereof, and the resultant reactant gases may be a mixed gas of the $SiH_4$, $NH_3$ and $N_2$, or mixed gas of the $SiH_2Cl_2$, $NH_3$ and $N_2$.

Step 6, forming the gate electrode and the gate line on the glass substrate.

For example, a metallic film layer having a thickness of 1500 Å~2500 Å is deposited on the first insulating layer with a magnetron sputtering apparatus, and the metal layer may be Mo, Al, Cu, W or the like, or any composite layer of the foresaid metals.

For example, the material of the layer is identical to that of the source electrode and the drain electrode.

Then, positive photoresist is applied on the glass substrate, and exposure and development technology are carried out sequentially.

Figure 17:
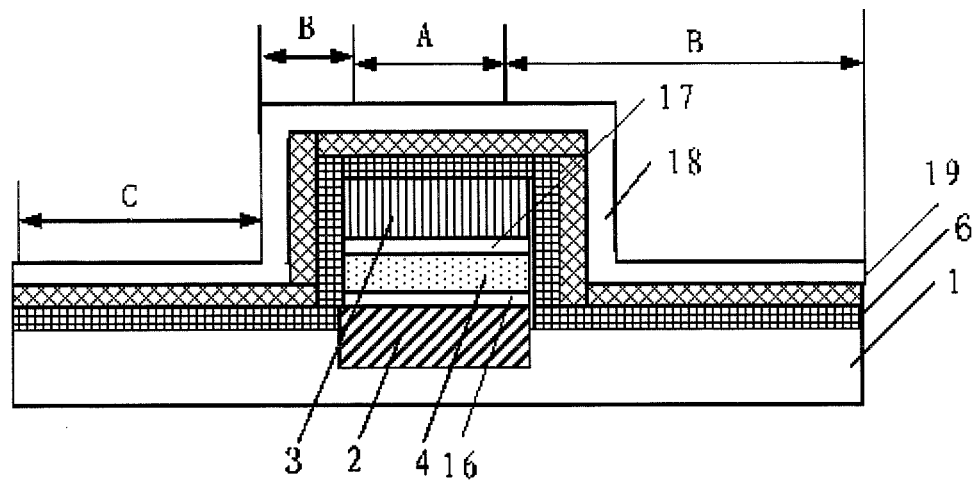
FIG. 17 is a schematic view of the array substrate in formation provided by the embodiment of the present disclosure, and photoresist is retained after half-tone mask exposure.

For example, during the exposing process, a half tone mask plate or a gray tone mask plate is employed for exposure, and after the development process, a photoresist completely-removed region A, a photoresist partially-retained region B and a photoresist completely-retained region C are obtained, as shown in FIG. 17. In the photoresist completely-retained region C, the photoresist is substantially entirely retained after development. In the photoresist layer 18, the completely-retained region C corresponds to the gate electrode or both the gate electrode and the gate line region, the completely-removed region A corresponds to the drain electrode region, the region A is used for forming the via hole on the insulating layer above the drain electrode, and the partially-retained region B corresponds to regions except the via hole, the gate line and the gate electrode.

Then, a wet etching process is performed once to etch away the metal layer 19 corresponding to the completely-removed region A of the photoresist layer 18, such that the first insulating layer 6 below the metal layer 19 is exposed. Then a dry etching process is performed once to etch away the first insulating layer 6 above the drain electrode, so as to form the via hole and expose the drain electrode 3. The via hole is used for electrically connecting with the pixel electrode.

Then the photoresist layer 18 in the partially-retained region B is subjected to an ashing process so as to remove the photoresist in the partially-retained region and expose the metal layer 19, and a wet etching process is performed once to etch away the exposed metal layer 19. Here, only the metal layer 19 in the completely-retained region C of the photoresist layer 18 is retained.

Figure 18:
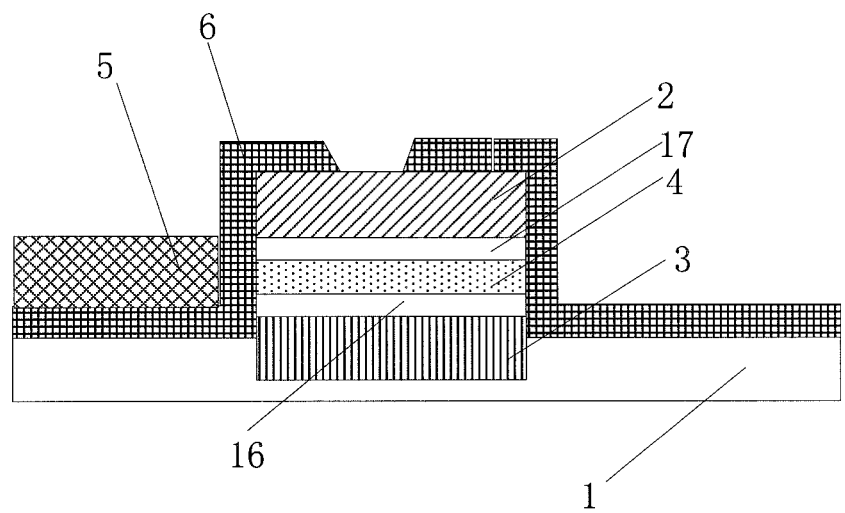
FIG. 18 is a structural view of the TFT in the array substrate in formation provided by the embodiment of the present disclosure, and the array substrate is formed with a gate electrode.

Finally, the photoresist in the completely-retained region C of the photoresist layer 18 is stripped off, the corresponding underlying metal layer 19 is thus exposed, this metal layer 19 corresponds to the gate electrode or both the gate electrode and the gate line, the resultant array substrate comprising the gate electrode and the gate line is as shown in FIG. 18.

In this manufacturing technology, the thickness of the gate electrode and the thickness of the first insulating layer are both preset. When the thickness of the gate electrode is determined, then the thickness of the first insulating layer is determined, and the thickness of the first insulating layer meets the requirement that the distance between the gate electrode and the source electrode equals to the distance between the gate electrode and the drain electrode.

In the film-forming process, an array substrate, in which the gate electrode and the source and drain electrode are self-aligned, is obtained. No mask plate is needed for the alignment between the gate electrode and the source and drain electrode.

Step 7, forming a layer of pixel electrode 14 on the array substrate shown in FIG. 18.

For example, a layer of indium tin oxides (ITO) film is formed on the glass substrate 1, and the pixel electrode 14 electrically connected with the drain electrode is formed by a photolithography process and an etching process.

For example, a second insulating layer 9 may be further formed on the array substrate, and the coverage of the second insulating layer 9 on the TFT meet the requirement that the pixel electrode region and external pad region for the gate electrode are not covered, such that the TFT can be driven through the exposed external pad of the gate electrode and the external pad of the data line. Alternatively, the pixel electrode 14 may be covered by the second insulating layer 9 thereon, which, however, is disadvantageous for light transmission.

The forming process of the second insulating layer 9 may be the same as that of the first insulating layer 6, and the material therefor may also be the same. This layer is used as a passivation protection layer for the TFT, keeping the TFT from exterior damage. The resultant array substrate is shown in FIG. 19.

It should be noted that the thickness of the first insulating layer and the depth of the source electrode in the groove can control the relative position of the gate electrode from the source and drain electrodes.

Because the source electrode is provided in the groove of the glass substrate, the thickness of the source electrode on the glass substrate is reduced, thus reducing the thickness of the formed first insulating layer and increasing the switching current of the TFT.

The gate electrode is provided on a side of the source electrode and the drain electrode, which are separated by a first insulating layer that works as the gate insulating layer. Such a design can decrease the TFT area remarkably and improves the aperture ratio of pixels.

Another embodiment of the method for manufacturing an array substrate provided by the present disclosure comprises:

S21, forming a pixel electrode on the substrate through a patterning process.

S22, forming a drain electrode on the substrate through a patterning process, the drain electrode being electrically connected with the pixel electrode.

S23, forming a semiconductor layer on the drain electrode through a patterning process, the vertical projection of the semiconductor layer having an overlapping area with the vertical projection of the drain electrode on the substrate.

S24, forming a source electrode as well as a data line electrically connected with the data line on the semiconductor layer through a patterning process, the vertical projections of the source electrode having overlapping area with the vertical projections of the drain electrode and the semiconductor layer on the substrate.

S25, forming a first insulating layer covering the entire substrate on the substrate through a patterning process.

S26, forming a gate electrode and a gate line on the first insulating layer in an area on the substrate different from the source electrode, the semiconductor layer and the drain electrode.

For example, prior to forming the pixel electrode, this method may further comprise: forming a groove on the substrate corresponding to the drain electrode to be formed, so as to form the drain electrode within the groove.

For example, after forming the drain electrode and prior to forming the semiconductor layer, the method may further comprise: forming a first ohmic contact layer on the semiconductor layer through a patterning process, the vertical projection of the first ohmic contact layer having an overlapping area with the vertical projection of the drain electrode on the substrate. Furthermore, after forming the semiconductor layer and prior to forming the source electrode and the data line, the method may further comprise: forming a second ohmic contact layer on the semiconductor layer through a patterning process, the vertical projection of the second ohmic contact layer having an overlapping area with the vertical projection of the semiconductor layer on the substrate.

In one example of the method form manufacturing an array substrate of this embodiment, the above steps, which are employed to form the array substrate, are identical except that the sequence for forming various layers is different. In this example, the sequence for forming various layers on the array substrate is as follows:

1, forming a pixel electrode on the glass substrate formed with a groove;

2, forming a drain electrode after the formation of the pixel electrode, wherein the drain electrode is provided in the groove, and therefore the depth of the groove in this method is provided to be deeper than that in the method for preparing the array substrate as shown in FIG. 12;

3, forming a first ohmic contact layer on the array substrate formed with the drain electrode;

4, forming a semiconductor layer on the array substrate formed with the first ohmic contact layer;

5, forming a second ohmic contact layer on the array substrate formed with the semiconductor layer;

6, forming a source electrode and a data line on the array substrate;

7, forming a first insulating layer on the array substrate formed with the source electrode and the data line;

8, forming a gate electrode and a gate line on the array substrate formed with the first insulating layer;

9, forming a second insulating layer (protection layer) on the array substrate formed with the gate electrode and the gate line.

The embodiment of the present disclosure also provides a display device, for example, a liquid crystal panel, a liquid crystal display, a liquid crystal TV, an OLED panel, an OLED display, an OLED TV, an electronic paper, and so on.

The embodiments of the disclosure being thus described, it will be obvious that the same may be varied in many ways. Such variations are not to be regarded as a departure from the spirit and scope of the disclosure, and all such modifications as would be obvious to those skilled in the art are intended to be included within the scope of the following claims.

What is claimed is:

1. An array substrate, comprising:
 a substrate, a gate electrode, a source electrode and a drain electrode, wherein the source electrode and the drain electrode are provided in different areas on the substrate, and vertical projections of the source electrode and the drain electrode on the substrate have an overlapping area;

a semiconductor layer formed between the source electrode and the drain electrode, wherein a vertical projection of the semiconductor layer on the substrate has overlapping areas with the vertical projections of the source electrode and the drain electrode on the substrate;

a first insulating layer formed on the substrate while below the gate electrode and covering the source electrode or the drain electrode;

a pixel electrodes electrically connected with the drain electrode;

a gate line electrically connected with the gate electrode;

a data line electrically connected with the source electrode; and at least one groove formed on the substrate corresponding to one of the source electrode and the drain electrode.

2. The array substrate according to claim 1, wherein the substrate is a glass substrate, or the substrate is a glass substrate formed with a passivation layer on its surface, and the passivation layer is formed on a side of the glass substrate to be formed with the source electrode or the drain electrode.

3. The array substrate according to claim 1, wherein the at least one groove is formed on the substrate corresponding to the source electrode,
wherein the source electrode is formed in the groove of the substrate, the semiconductor layer is formed on the source electrode, the drain electrode is formed on the semiconductor layer, the first insulating layer is formed on the drain electrode, the pixel electrode is formed on the first insulating layer; wherein the pixel electrode is electrically connected with the drain electrode through the via hole on the first insulating layer.

4. The array substrate according to claim 1, wherein the at least one groove is formed on the substrate corresponding to the source electrode and the data line respectively,
wherein the groove corresponding to the source electrode is communicated with the groove corresponding to the data line;
wherein the source electrode and the data line are formed in the corresponding grooves of the substrate respectively, the semiconductor layer is formed on the source electrode, the drain electrode is formed on the semiconductor layer, the first insulating layer is formed on the drain electrode, the pixel electrode is formed on the first insulating layer; and
wherein the pixel electrode is electrically connected with the drain electrode through the via hole on the first insulating layer.

5. The array substrate according to claim 1, wherein the at least one groove is formed on the substrate corresponding to the drain electrode;
wherein the pixel electrode is formed on the substrate and a part of the pixel electrode is formed in the groove, the drain electrode is formed in the groove formed with the pixel electrode therein, the semiconductor layer is formed on the drain electrode, the source electrode is formed on the semiconductor layer, and the first insulating layer is formed on the source electrode.

6. The array substrate according to claim 1, further comprising a first ohmic contact layer and a second ohmic contact layer,
wherein the first ohmic contact layer is formed between the source electrode and the semiconductor layer, the second ohmic contact layer is formed between the drain electrode and the semiconductor layer, and vertical projections of the first ohmic contact layer and the second ohmic contact layer have overlapping areas with the vertical projections of the source electrode, the drain electrode and the semiconductor layer on the substrate.

7. The array substrate according to claim 6, wherein the vertical projections of the source electrode, the drain electrode, the semiconductor layer as well as the first ohmic contact layer and the second ohmic contact layer on the substrate overlap each other entirely.

8. The array substrate according to claim 1, wherein the source electrode and the drain electrode are equal to each other in thickness.

9. The array substrate according to claim 1, wherein the first insulating layer further comprises a portion formed on the substrate and below the gate electrode.

10. The array substrate according to claim 1, wherein a vertical distance between the gate electrode and the source electrode equals to a vertical distance between the gate electrode and the drain electrode, and the overlapping area of the gate electrode with the source electrode equals to the overlapping area of the gate electrode with the drain electrode.

11. The array substrate according to claim 1, further comprising a second insulating layer formed on the gate electrode.

12. An array substrate, comprising:
a substrate, a gate electrode, a source electrode and a drain electrode, wherein the source electrode and the drain electrode are provided in different areas on the substrate, and vertical projections of the source electrode and the drain electrode on the substrate have an overlapping area;

a semiconductor layer formed between the source electrode and the drain electrode, wherein a vertical projection of the semiconductor layer on the substrate has overlapping areas with the vertical projections of the source electrode and the drain electrode on the substrate;

a first insulating layer formed on the substrate while below the gate electrode and covering the source electrode or the drain electrode;

a pixel electrodes electrically connected with the drain electrode;

a gate line electrically connected with the gate electrode; and a data line electrically connected with the source electrode;

wherein the pixel electrode, the drain electrode, the semiconductor layer, the source electrode and the first insulating layer are formed on the substrate in order, and the pixel electrode is formed on the substrate, the drain electrode is formed on the pixel electrode, the semiconductor layer is formed on the drain electrode, the source electrode is formed on the semiconductor layer, and the first insulating layer is formed on the source electrode.

13. The array substrate according to claim 12, further comprising a first ohmic contact layer and a second ohmic contact layer,
wherein the first ohmic contact layer is formed between the source electrode and the semiconductor layer, the second ohmic contact layer is formed between the drain electrode and the semiconductor layer, and vertical projections of the first ohmic contact layer and the second ohmic contact layer have overlapping areas with the vertical projections of the source electrode, the drain electrode and the semiconductor layer on the substrate.

14. The array substrate according to claim 13, wherein the vertical projections of the source electrode, the drain electrode, the semiconductor layer as well as the first ohmic contact layer and the second ohmic contact layer on the substrate overlap each other entirely.

15. The array substrate according to claim 12, wherein the source electrode and the drain electrode are equal to each other in thickness.

16. The array substrate according to claim 12, wherein a vertical distance between the gate electrode and the source electrode equals to a vertical distance between the gate electrode and the drain electrode, and the overlapping area of the gate electrode with the source electrode equals to the overlapping area of the gate electrode with the drain electrode.

17. An array substrate, comprising:
- a substrate, a gate electrode, a source electrode and a drain electrode, wherein the source electrode and the drain electrode are provided in different areas on the substrate, and vertical projections of the source electrode and the drain electrode on the substrate have an overlapping area;
- a semiconductor layer formed between the source electrode and the drain electrode, wherein a vertical projection of the semiconductor layer on the substrate has overlapping areas with the vertical projections of the source electrode and the drain electrode on the substrate;
- a first insulating layer formed on the substrate while below the gate electrode and covering the source electrode or the drain electrode;
- a pixel electrodes electrically connected with the drain electrode;
- a gate line electrically connected with the gate electrode; and
- a data line electrically connected with the source electrode;

wherein a vertical distance between the gate electrode and the source electrode equals to a vertical distance between the gate electrode and the drain electrode, and the overlapping area of the gate electrode with the source electrode equals to the overlapping area of the gate electrode with the drain electrode.

18. The array substrate according to claim 17, wherein the source electrode and the data line are formed on the substrate, the semiconductor layer is formed on the source electrode, the drain electrode is formed on the semiconductor layer, the first insulating layer is formed on the drain electrode, the pixel electrode is formed on the first insulating layer; and wherein the pixel electrode is electrically connected to the drain electrode through a via hole on the first insulating layer.

19. The array substrate according to claim 17, further comprising a first ohmic contact layer and a second ohmic contact layer,
wherein the first ohmic contact layer is formed between the source electrode and the semiconductor layer, the second ohmic contact layer is formed between the drain electrode and the semiconductor layer, and vertical projections of the first ohmic contact layer and the second ohmic contact layer have overlapping areas with the vertical projections of the source electrode, the drain electrode and the semiconductor layer on the substrate.

20. The array substrate according to claim 17, wherein the source electrode and the drain electrode are equal to each other in thickness.

* * * * *